United States Patent [19]

Liermann et al.

[11] 4,205,307

[45] May 27, 1980

[54] DEVICE FOR MONITORING THE FUNCTION OF ELECTROMAGNETS

[75] Inventors: Peter Liermann, Gehrden; Lutz Weise, Mainz, both of Fed. Rep. of Germany

[73] Assignee: WABCO Westinghouse GmbH, Hanover, Fed. Rep. of Germany

[21] Appl. No.: 956,001

[22] Filed: Oct. 30, 1978

[51] Int. Cl.$^2$ .............................................. G08B 21/00
[52] U.S. Cl. .................... 340/644; 340/661; 340/664; 361/159
[58] Field of Search ............... 340/52 B, 635, 644, 340/660, 661, 664; 361/159

[56] References Cited

U.S. PATENT DOCUMENTS

| | | | |
|---|---|---|---|
| 3,028,587 | 4/1962 | Vaccaro | 340/664 |
| 3,103,653 | 9/1963 | Schultz et al. | 340/635 |
| 3,125,271 | 3/1964 | Marshall | 361/159 |
| 3,275,899 | 9/1966 | De Wolf | 361/159 |
| 3,678,344 | 7/1972 | Wedmore | 361/159 |
| 3,740,615 | 6/1973 | Vigini | 361/159 |
| 3,911,360 | 10/1975 | Kimzey | 340/661 |
| 4,065,758 | 12/1977 | Barbier et al. | 340/661 |

Primary Examiner—Gerald Brigance
Attorney, Agent, or Firm—A. G. Williamson, Jr.; R. W. McIntire, Jr.

[57] ABSTRACT

A first amplifier measures the instantaneous voltage across a resistor, connected in series with the electromagnet of a solenoid valve, as the current increases following energization of the electromagnet. A second amplifier measures the same voltage and stores the peak value in a capacitor. The two measured voltages are applied to a comparator which detects the difference, and generates an output, when operation of the electromagnet armature causes a transient reduction in the resistor voltage. Initial energization of the electromagnet sets a memory and starts a monostable timing period. The set output of the memory primes one input of an AND gate, the second input being inhibited by the monostable output during timing. If the electromagnet armature operates normally, the comparator output resets the memory and removes the AND gate priming signal prior to completion of the timing period. If the armature fails to operate the monostable output following the timing period completes the actuation of the AND gate to produce a fault signal.

6 Claims, 1 Drawing Figure

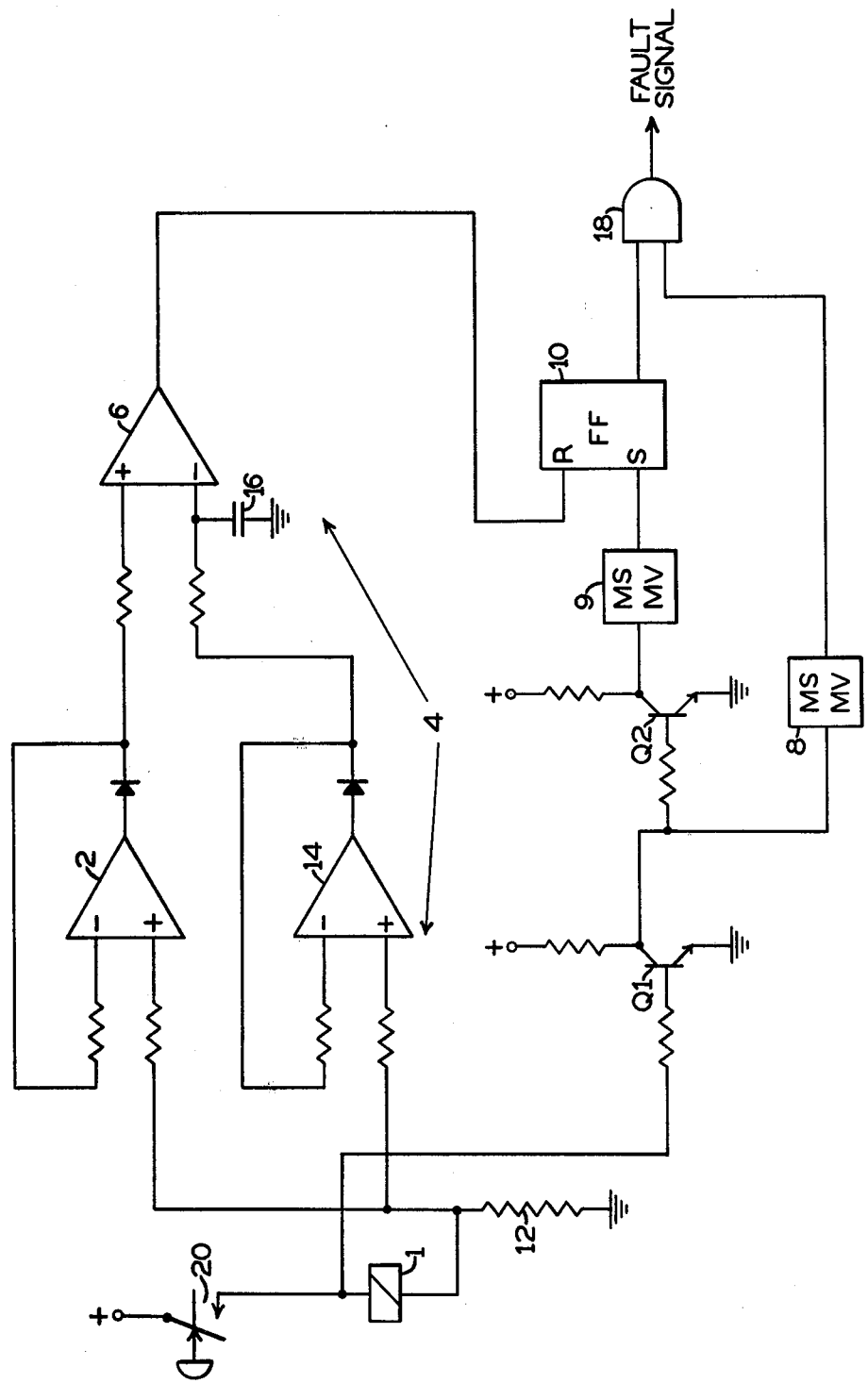

DEVICE FOR MONITORING THE FUNCTION OF ELECTROMAGNETS

BACKGROUND OF THE INVENTION

The invention pertains to apparatus for monitoring the operation of electromagnets. More specifically, the invention is directed to apparatus for monitoring the operation of electromagnetic type solenoid valves in motor vehicle brake systems.

The operability condition and/or the response to demand of electromagnets in the solenoid valves controlling the brakes of motor vehicles is of primary importance in the operational safety of such vehicles. Apparatus for detecting discontinuities in the electrical control circuits for such solenoid valves or in the winding of the electromagnet and for detecting short circuits in the leads or coil windings is known in the art. However, proper operation of the solenoid valve may be prevented by partial shorts in the magnet winding which are not detectable by the available checking apparatus. Also, mechanical problems or faults may prevent operation of the valve. For example, the armature controlled by the electromagnet may stick or be rusted in place, due to corrosion factors such as winter salt use or industrial gases. This type of failure is critical on brake valves which are infrequently used. Additional fault detecting or monitoring apparatus for these conditions is desirable.

Accordingly, an object of the invention is improved apparatus for monitoring the operation of electromagnets.

Another object of the invention is apparatus for detecting the failure of the electromagnet armature of a solenoid valve to operate when energy is applied.

A further object of the invention is a circuit arrangement which detects the movement of the armature of an electromagnet in accordance with energizing current variations to reset a memory unit prior to the expiration of a preset timing period running from the initial energization of the electromagnet and indicates a fault condition when no movement is detected during the timing period.

Other objects, features, and advantages of the invention will become apparent from the following specification and appended claims, when taken in connection with the accompanying drawing.

SUMMARY OF THE INVENTION

According to the invention, apparatus is provided which includes an arrangement for measuring and sensing variations in the increase of current flowing through the electromagnet, upon application of voltage, which variations are caused by the movement or operation of the armature. This arrangement is based on the characteristic of inductive electrical loads to produce a current directed against the applied voltage so that the measured current, after initial application of energizing voltage, rises gradually to its normal value according to an exponential function. Further, upon movement of the armature, a supplemental transient countercurrent is produced which results in a reduction in the measured normal current rise for the duration of the movement. This current reduction, or the corresponding voltage drop in a resistor through which the energizing current flows, is sensed by the invention arrangement. A signal resulting from this voltage drop is matched against a timing period during which the armature should normally operate. Detection of the lack of the sensing signal during the timing period results in the generation of a fault signal indicating that the armature has failed to operate to activate the associated solenoid valve.

SPECIFIC DESCRIPTION OF THE ILLUSTRATED EMBODIMENT

The invention will now be described in more specific detail, on the basis of the single drawing FIGURE which is a circuit diagram illustrating a preferred embodiment of the invention.

Referring to the drawing, the monitoring arrangement illustrated is to check the proper functioning of the electromagnet 1, shown by conventional winding symbol at the left. This electromagnet is, for example, the actuating element for a motor vehicle solenoid brake valve, which will be operated by movement of the electromagnet armature when the winding is energized. The armature and the brake valve, together with the operating coupling, are not shown since such arrangements are well known. The electromagnet 1 is selectively energized by connection across a direct current source, e.g., the vehicle battery, not shown but having a positive terminal designated by the + symbol and a negative terminal designated by the usual ground symbol. The energizing circuit for device 1 includes a measuring resistor 12, the electromagnet winding 1, and a normally open switch contact 20, illustrated as controlled by a conventional push-to-close pushbutton device. Contact 20 may also be controlled, for example, by a foot brake pedal or by a brake control lever. When contact 20 is closed, the electromagnet winding 1 is connected across source terminals + and ground in series with resistor 12.

The monitoring arrangement further includes an amplifier 2, a peak value measuring circuit network 4 comprising an amplifier 14 and a capacitor 16, a comparator 6, monostable multivibrators 8 and 9, a memory circuit or flip-flop 10, a fault detector element shown as AND gate 18, and two transistors Q1 and Q2. It is noted that transistor Q1 is normally nonconducting due to the ground potential on its base with switch 20 open. Transistor Q2, however, is normally conducting due to the positive potential on its base from the collector of transistor Q1. This same positive signal is applied to the input of monostable unit 8 so that this element is in its stable state and a logic 1 output signal exists. The ground (negative) potential at the collector of transistor Q2 is applied to the input of monostable unit 9 so that its output is a logic 0 signal. The flip-flop 10 is in its reset condition, as a result of the last trigger signal applied, and its single output is so connected that a logic 0 output exists. The AND gate element 18, with one input at logic 0, thus produces no output indication.

Amplifier circuit 2 serves to measure the instantaneous value of the voltage across resistor 12 and amplify this signal at a predetermined gain. Since resistor 12 is connected in series with winding 1, the voltage drop across this resistor is proportional to, i.e., a measure of, the current flowing in the winding and the output of amplifier 2 indicates the current level.

Amplifier 14 also measures this same voltage signal and amplifies it at the same gain level as amplifier 2. However, the instantaneous output of amplifier 14 is stored in capacitor 16. The time value of the peak value measuring network 4 for charging capacitor 16 is selected to be negligibly small, so that capacitor 16 immediately follows all voltage increases. The time constant for discharge, conversely, is large in comparison to the rate of change of the voltage across resistor 12 so that the peak value circuit 4, and specifically capacitor 16, cannot follow transient current decreases. The outputs of amplifier 2 and circuit 4 are applied to comparator unit 6 which generates an output, i.e., a logic 1 signal, only when a difference in the input signals is detected.

When switch 20 is closed to energize electromagnet 1, the positive potential suddenly appearing at its base causes transistor Q1 to become conducting. The ground potential now appearing at the collector of transistor Q1 turns off transistor Q2 and triggers monostable element 8 to initiate its timing period, its output shifting and holding during this period at a logic 0 to inhibit AND gate 18. The positive potential at the collector of transistor Q2 triggers monostable unit 9 to apply a brief pulse to set memory or flip-flop element 10. However, the logic 1 output signal now appearing from element 10 is ineffective to actuate AND gate 18 which is already inhibited at its other input.

The current through the electromagnet winding, and thus through resistor 12, increases in accordance with an exponential function due to induced countervoltages. The instantaneous voltage drop across resistor 12 is measured by amplifier 2 and also by amplifier 14, with the peak value of the output from this latter element stored in capacitor 16. The two measurement outputs are compared by comparator unit 6. As long as the current, and thus the voltage at resistor 12, continues to rise gradually, the inputs to unit 6 are equal and no output signal is generated.

When the armature of electromagnet 1 moves as a result of the winding energization, a supplementary countervoltage is induced which opposes the applied voltage. This causes a transient reduction in the current flowing in the circuit, which results in a corresponding voltage decrease across resistor 12. This transient decrease in the instantaneous voltage value is registered by amplifier 2 but the peak value network 4 maintains the measurement stored in capacitor 16. A voltage difference thus occurs at the inputs to comparator 6 which then produces an output signal.

This output signal, a logic 1, resets the memory flip-flop 10 so that its output shifts to a logic 0. Under normal conditions, the armature operates prior to the end of the timing period of monostable unit 8. Thus when unit 8 restores a logic 1 signal to the lower input of AND gate 18, this unit remains inhibited because the upper input has already been restored to a logic 0. However, if the armature fails to operate for any reason, e.g., stuck, partial short in winding, the countervoltage is not induced and no transient current reduction occurs. There is thus no decrease in resistor 12 voltage to be measured by amplifier 2. The input signals to comparator 6 remain equal and this unit does not generate an output. Memory unit 10 is not reset, since no signal is received from unit 6, and continues to output a logic 1 signal to AND gate 18. When monostable element 8 compleres its timing period, a second logic 1 signal is applied to the AND gate and this unit outputs a fault signal which indicates a lack of movement by the armature and thus a failure of the solenoid brake valve to operate. Alternate actions may then be taken to assure vehicle braking.

The invention thus provides a simple yet effective arrangement for immediately detecting the operating condition of a solenoid type brake valve when a request for vehicle braking is made. A relatively small amount of apparatus is required, all standard elements readily available without requiring special design. The resulting package also is kept small so that little additional mounting space is needed. An efficient and economical arrangement for checking the operability of brake valves is therefore provided.

Although only one form of apparatus for monitoring the operation of an electromagnet embodying the invention has been shown and described herein, it is to be understood that various changes and modifications, within the scope of the appended claims, may be made therein without departing from the spirit and scope of the invention.

Having now described the invention, what we claim as new and desire to secure by Letters Patent, is:

1. Apparatus for monitoring the operation of a solenoid, which includes an electromagnet having a movable armature normally occupying a first position and operating to another position when the electromagnet is energized, comprising in combination,
   (a) a sensing means coupled to said electromagnet and responsive to current flow through the electromagnet winding for sensing variations in that current when said armature operates to its energized position after said electromagnet is initially energized,
      (1) said sensing means generating an output signal when an armature actuated current variation is sensed,
   (b) a memory means coupled to said electromagnet and responsive to current flow for registering an indication of the initial application of energy to said electromagnet and for generating an output signal while said indication is stored,
      (1) said memory means further controlled by said sensing means for cancelling said registered indication of said energy application when a sensing means output signal is generated,
   (c) timing means coupled to said electromagnet and responsive to the initial application of energy to said electromagnet for initiating a predetermined timing period,
      (1) said timing period having a length longer than the normal interval from initial energization to operation of said armature,
      (2) said timing means normally producing an output signal except during said timing period, and
   (d) a detector means coupled to said memory means and said timing means and responsive to the simultaneous reception of the output signals from both such means for producing a fault signal indicating the non-operation of said armature after energization of said electromagnet.

2. Monitoring apparatus as defined in claim 1 which further includes,
   (a) a resistor connected in series with said electromagnet for producing a voltage drop which is continuously proportional to energizing current flowing through said electromagnet,
   and in which said sensing means comprises,
   (b) an instantaneous voltage measuring means coupled to said resistor for measuring the instantaneous voltage proportional to the variable current following the initial energization of said electromagnet,
   (c) a peak value voltage measuring means coupled to said resistor for measuring and storing the peak value of voltage proportional to the variable current attained following the initial energization of said electromagnet, and
(d) a comparator means coupled for receiving the voltage signals measured by said instantaneous and said peak value voltage measuring means and responsive to the difference when the armature movement reduces the current flowing through said electromagnet for generating an output signal
(e) said comparator means further coupled for supplying said output signal to said memory means.

3. Monitoring apparatus as defined in claim 2 in which,
(a) said memory means is a flip-flop circuit arrangement normally in its reset condition and responsive to a signal generated by the initial application of energy to said electromagnet for operating to a set condition,
  (1) said flip-flop circuit generating an output signal only when in said set condition,
  (2) said flip-flop circuit also coupled to said comparator means and responsive to its output signal for operating to said reset condition, and
(b) said detector means is a two input AND gate coupled to receive actuating signals from said flip-flop circuit and said timing means and responsive only to simultaneous input of both signals for producing a fault signal indicating the non-operation of said armature.

4. Monitoring apparatus as defined in claim 3 in which,
(a) said timing means is a first monostable circuit arrangement coupled to said electromagnet and responsive to the signal generated by initial application of energy to said electromagnet for producing said predetermined timing period at least longer than the normal elapsed time for operation of said electromagnet armature following energization, and
(b) said first monostable circuit is coupled to said AND gate for supplying an actuating signal thereto except during said timing period.

5. Monitoring apparatus as defined in claim 4 which further includes,
(a) a first transistor coupled between said first monostable circuit and said electromagnet and responsive to said signal generated by the initial application of energy to said electromagnet for supplying a signal to actuate the production of said timing period by said first monostable circuit, and
(b) a second transistor and a second monostable circuit arrangement coupled into a series network further coupled between said flip-flop circuit and said first transistor,
  (1) said second transistor responsive to said actuating signal from said first transistor for driving said second monostable circuit to supply a pulse signal for operating said flip-flop circuit to its set condition.

6. Monitoring apparatus as defined in claim 2 or 5 in which,
(a) said instantaneous voltage measuring means is an amplifier circuit responsive to the voltage drop across said resistor for supplying an amplified output signal, with a predetermined gain to one input of said comparator means,
and in which said peak value voltage measuring means comprises,
(b) another amplifier circuit responsive to the voltage drop across said resistor for supplying an amplified output signal also having said predetermined gain to the other input of said comparator means, and
(c) a capacitor coupled to said other amplifier circuit and said comparator means for maintaining the peak value of said other amplifier output signal applied to said comparator means when the voltage drop across said resistor momentarily reduces.

* * * * *